(12) United States Patent
Nakajima

(10) Patent No.: US 9,070,736 B2
(45) Date of Patent: Jun. 30, 2015

(54) SEMICONDUCTOR DEVICE

(71) Applicant: FUJI ELECTRIC CO., LTD., Kawasaki-shi (JP)

(72) Inventor: Tsunehiro Nakajima, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/476,192

(22) Filed: Sep. 3, 2014

(65) Prior Publication Data

US 2014/0367738 A1    Dec. 18, 2014

Related U.S. Application Data

(63) Continuation of application No. PCT/JP2013/063610, filed on May 15, 2013.

(30) Foreign Application Priority Data

May 15, 2012    (JP) .................................. 2012-111193

(51) Int. Cl.

| H01L 29/66 | (2006.01) |
|---|---|
| H01L 29/739 | (2006.01) |
| H01L 23/498 | (2006.01) |
| H01L 29/45 | (2006.01) |
| H01L 29/40 | (2006.01) |
| H01L 29/06 | (2006.01) |

(52) U.S. Cl.
CPC .......... *H01L 29/7393* (2013.01); *H01L 29/739* (2013.01); *H01L 29/404* (2013.01); *H01L 29/0619* (2013.01); *H01L 29/0661* (2013.01); *H01L 23/49866* (2013.01); *H01L 29/45* (2013.01)

(58) Field of Classification Search
None
See application file for complete search history.

(56) References Cited

U.S. PATENT DOCUMENTS

| 5,122,856 A | 6/1992 | Komiya |
|---|---|---|
| 2007/0004098 A1 | 1/2007 | Kazama et al. |
| 2010/0019381 A1* | 1/2010 | Haeberlen et al. ............ 257/737 |
| 2011/0108883 A1* | 5/2011 | Tsukamoto et al. .......... 257/144 |
| 2011/0215435 A1 | 9/2011 | Wakimoto et al. |

(Continued)

FOREIGN PATENT DOCUMENTS

| JP | H08-21675 B2 | 3/1996 |
|---|---|---|
| JP | 2006-059929 A | 3/2006 |
| JP | 2007-036211 A | 2/2007 |

(Continued)

*Primary Examiner* — William Coleman
*Assistant Examiner* — Kien Ly
(74) *Attorney, Agent, or Firm* — Rabin & Berdo, P.C.

(57) ABSTRACT

A p-type thin-layer along a side wall surface of a V-shaped groove reaching the bottom portion of a p-type isolation layer from the back surface of an $n^-$ semiconductor substrate, couples a p-type collector layer with the p-type isolation layer. A collector electrode contacts the surfaces of the p-type collector layer and the p-type thin-layer. The collector electrode is formed by laminating an Al—Si film, a barrier layer, a nickel-based metal film, and a gold-based metal film in sequence from the $n^-$ semiconductor substrate side. The Al—Si film contacting the surface of the p-type collector layer is in a range of 1.1 to 3.0 μm in thickness. The Al—Si film contacting the surface of the p-type thin-layer is in a range of 0.55 to 1.5 μm in thickness. A rise in leak current caused by aluminum spiking is eliminated or suppressed, and solder joining including tin is made easier.

15 Claims, 6 Drawing Sheets

(56) References Cited

U.S. PATENT DOCUMENTS

2012/0007241 A1* 1/2012 Mizuno .................. 257/751
2012/0313224 A1 12/2012 Fukuda et al.

FOREIGN PATENT DOCUMENTS

| | | |
|---|---|---|
| JP | 2011-181770 A | 9/2011 |
| JP | 2011-258833 A | 12/2011 |

* cited by examiner

1 …

SEMICONDUCTOR DEVICE

This application is a continuation under 35 U.S.C. 120 of International Application PCT/JP2013/063610 having the International Filing Date of May 15, 2013, and having the benefit of the earlier filing date of Japanese Application No. 2012-111193, filed May 15, 2012. All of the identified applications are fully incorporated herein by reference.

TECHNICAL FIELD

The present invention relates to a semiconductor device.

BACKGROUND ART

A power conversion apparatus is in growing demand attributable to current measures for controlling carbon dioxide ($CO_2$) emission, development in smart grid, and the like. The growth will continue also in future. The power conversion apparatus is conventionally equipped with multiple power semiconductor devices such as a bipolar junction transistor (BJT), an insulated gate bipolar transistor (IGBT), a metal-oxide-semiconductor field effect transistor (MOSFET), and a free-wheeling diode (FWD).

The power conversion apparatus is accompanied by no small energy loss. Then, decreasing the loss is a problem to be solved not only in the past but also at present. In order to decrease the loss in the power conversion apparatus, power semiconductor devices equipped therein have historically been replaced from BJTs, which belong to a current driven type with higher loss, to IGBTs or MOSFETs, which belong to a voltage driven type with lower loss. Further, among these devices equipped in the power conversion apparatus, IGBTs attract attention, in particular, because of high speed switching features and voltage driven characteristics that MOSFETs possess along with low on-state voltage characteristics that bipolar transistors possess.

Moreover, with regard to a method for fabricating devices such as an IGBT and a MOSFET equipped in the power conversion apparatus, improvements have been achieved one after the other in size reduction processes, wafer thinning processes, and the like, causing the loss of the device itself to decrease furthermore. Along with this, miniaturizing the device and lowering the costs are also in progress simultaneously. As a result, an application range for these devices is enlarged from industrial fields such as a general-purpose inverter, an AC servo, an uninterruptible power supply (UPS), and a switching power supply to consumer appliance fields such as a microwave oven, a rice cooker, and a stroboscope.

On the other hand, in the power conversion circuits which perform AC (alternating current)/AC conversion, AC/DC (direct current) conversion, and DC/AC conversion, a matrix converter attracts attention as a direct conversion circuit which can eliminate a direct current smoothing circuit configured by an electrolytic capacitor, a direct current reactor, and the like. The matrix converter is employed under AC voltage. A plurality of switching devices used as components of the matrix converter require a bi-directional switching device, in which current is controllable for both forward and reverse directions, having bi-directional electrical characteristics. An IGBT having breakdown voltage characteristics bi-directionally for both forward and reverse direction (hereinafter, described as "reverse blocking IGBT") is known as such a bi-directional switching device.

Making up the device configuration in which the reverse blocking IGBTs are connected in anti-parallel eliminates reverse blocking diodes required if conventional IGBTs are employed to configure a bi-directional switching element, enabling the loss of the bi-directional switching device to decrease. Moreover, lowered loss of the bi-directional switching device can achieve miniaturization, weight reduction, efficiency increase, high-speed response, cost reduction, and the like for the matrix converter. In this context, market demand for reverse blocking IGBTs has increased in recent years. The reverse blocking IGBTs have highly reliable characteristics even for the reverse breakdown voltage in addition to normal forward breakdown voltage. It is required to provide the reverse blocking IGBTs having such characteristics with lower costs.

A reverse blocking IGBT 100 which has a sectional structure at the end portion of a semiconductor substrate (chip) shown in FIG. 5 is known as a conventional reverse blocking IGBT (for example, see the following Patent Literature 1). FIG. 5 is a sectional view illustrating an essential structure of the conventional reverse blocking IGBT. An earlier reverse blocking IGBT (for example, see FIG. 14 in the following Patent Literature 2) than the reverse blocking IGBT 100 requires a deep diffusion layer (p-type isolation layer) which stretches from the front surface to the back surface across a semiconductor substrate. Forming the deep diffusion layer (p-type isolation layer), however, is accompanied by many undesirable problems (characteristic failures and cost increase). Then, the practical use is known to be low.

So, as far the reverse blocking IGBT 100 shown in FIG. 5 is concerned, instead of the p-type isolation layer having the conventional deep diffusion layer, configuring a shallower p-type isolation layer 4 formed from the front surface of the substrate to the predetermined depth thereof reduces the problems occurring in the reverse blocking IGBT with the p-type isolation layer having the conventional deep diffusion layer, raising the practical use. In the reverse blocking IGBT 100 with such a p-type isolation layer 4, a V-shaped groove 8 is formed from the back surface side opposite to the p-type isolation layer 4 having a depth that the base portion thereof contacts the bottom portion of the p-type isolation layer 4. A p-type collector 9 is formed at the back surface flat portion surrounded by the V-shaped groove 8. A p-type thin-layer 11 is formed along the inside face (side wall portion 10) of the V-shaped groove 8. The p-type thin-layer 11 is in contact with the p-type isolation layer 4 and the p-type collector layer 9.

Since the p-type thin-layer 11 contacts the p-type isolation layer 4 and the p-type collector layer 9 with the same conductivity-type, the p-type isolation layer 4 has a similar function to the p-type isolation layer having the deep diffusion layer described above. Configuring the reverse blocking IGBT 100 with such a p-type isolation layer 4 not only eliminates the formation of the p-type isolation layer including a deep diffusion layer which needs conventional diffusion for long hours at a high temperature, but also allows demerits to be avoided for a decrease in breakdown voltage owing to generation of donors in a n⁻ drift layer 1 accompanied by the diffusion for long hours at a high temperature, an increase in leak current owing to occurrence of crystal defects, deterioration in throughput of facilities, and the like. Numeral 5 indicates a guard ring; numeral 6 indicates a field insulation film; numeral 7 indicates a field plate; and numeral 12 indicates a collector electrode.

In the meantime, with regard to a technique for forming a collector electrode of an IGBT, there is provided that reverse breakdown voltage failures caused by what aluminum (Al) spiking occurs can be reduced. The content is as follows. A collector electrode including an Al—Si (aluminum-silicon) film as a first layer is formed on a surface of a collector layer. The aluminum silicon film has a thickness of 0.3 to 1.0 μm and a silicon concentration of 0.5 to 2 wt. %, preferably 1 wt. % (for example, see the following Patent literature 2).

The aluminum spiking phenomenon is explained so that rising in temperature during soldering between a collector electrode and a joined member in assembly process mounting a chip causes mutual diffusion between silicon atoms in a silicon substrate and aluminum atoms in an Al—Si film contacting the silicon substrate directly among the metal films constituting the collector electrode on the back surface of the chip, and then aluminum atoms deposit in the micro recess where silicon atoms leave from the silicon substrate. The aspect is called "aluminum spiking". The phenomenon, although related to the temperature in soldering, occurs easily when the silicon concentration is low or nothing in the Al—Si film. And, if a pn junction between an n drift layer and a p-type collector layer is shallow in depth from the back surface of the substrate, the aluminum spiking occurring on the back surface of the substrate easily reaches the pn junction. There is a problem that the reverse breakdown voltage characteristics deteriorate.

Further, regarding a technique for forming a collector electrode of an IGBT, there is provided that forming a metal film including nickel (Ni) film of 0.6 to 0.8 μm in thickness for a collector electrode allows wafer warp to be reduced and permits failures owing to cracks and scratches introduced in a wafer to be reduced when transferring wafers and the like (for example, see the following Patent Literature 3).

CITATION LIST

Patent Literature

Patent Literature 1: Japanese Patent Application Laid-Open No. 2011-181770 (FIGS. 1-3)
Patent Literature 2: JP-A 2007-36211 (Abstract, paragraph [0016])
Patent Literature 3: JP-A 2006-59929 (paragraphs [0018]-[0019])

As a result of repeated studies by the present inventor zealously, however, on the conventional reverse blocking IGBT 100, which has a structure shown in FIG. 5, described in Patent literature 1 or suggested by the description of Patent literature 1, even if the collector electrode 12, which includes mainly a metal laminated film configured by Al—Si/Ti/Ni/Au and the like that match to a condition described in above Patent literature 2, is formed, it is ascertained that reverse breakdown voltage failures caused by generation of aluminum spiking are not dissolved yet. According to the above Patent Literature 2, this problem caused by the aluminum spiking occurs easily under the following conditions: a thin Al—Si film contacting the surface of p-type collector layer 9 in thickness among the metal laminated film constituting the collector electrode 12, additionally a thin p-type collector layer 9 in thickness, and a pn junction disposed at a very close place to the back surface of the substrate between the n⁻ drift layer 1 and p-type collector layer 9. If the aluminum spiking developed at the back surface of the substrate reaches the pn junction between the n⁻ drift layer 1 and the p-type collector layer 9, a leak current increase and breakdown voltage deterioration are highly liable to occur.

In order to solve the problem of the conventional art described above, it is an object of the present invention to provide a semiconductor device that is able to eliminate a rise in leak current caused by aluminum spiking and to perform solder joining properly and easily.

SUMMARY

To solve the problems described above, and to achieve the object of the present invention, a semiconductor device according to the present invention comprises the following. A p-type isolation layer is disposed from one principal surface of an n-type semiconductor substrate, having a predetermined depth. The p-type isolation layer surrounds a semiconductor function region. A V-shaped groove is disposed so as to reach the bottom portion of the isolation layer from the other principal surface of the semiconductor substrate. A p-type semiconductor layer is formed at a part surrounded by the V-shaped groove disposed in the other principal surface of the semiconductor substrate. A p-type semiconductor thin-layer is formed along a side wall of the V-shaped groove. The p-type semiconductor thin-layer couples the p-type isolation layer with the p-type semiconductor layer. A metal electrode is disposed so as to contact a surface of the p-type semiconductor layer and a surface of the p-type semiconductor thin-layer. The metal electrode includes at least a laminated film configured in the sequence of a first metal film being an Al—Si film, a second metal film including a metal with solder wettability principally, and a third metal film which prevents the second metal film from being oxidized from the semiconductor substrate side. The Al—Si film is in a range of 1.1 to 3.0 μm in thickness at the part contacting the surface of the p-type semiconductor layer. The Al—Si film is in a range of 0.55 to 1.5 μm in thickness at the part contacting the surface of the p-type semiconductor thin-layer.

In the semiconductor device according to the above aspect of the invention, the metal electrode can further include a barrier layer, which has principally a metal with a higher melting point than the Al—Si film and the second metal film, between the Al—Si film and the second metal film.

In the semiconductor device according to the above aspect of the invention, the barrier layer is may be a metal film including principally any metal of titanium, tungsten, or platinum.

In the semiconductor device according to the above aspect of the invention, the barrier layer may be in a range of 0.08 to 0.2 μm in thickness at the part laminated on the surface of the p-type semiconductor layer and in a range of 0.03 to 0.1 μm in thickness at the part laminated on the surface of the p-type semiconductor thin-layer.

In the semiconductor device according to the above aspect of the invention, the second metal film is a nickel film, wherein the second metal film may be in a range of 0.2 to 1.2 μm in thickness at the part laminated on the surface of the p-type semiconductor layer, and wherein the second metal film may be any of 0.1 to 0.6 μm in thickness at the part laminated on the surface of the p-type semiconductor thin-layer.

In the semiconductor device according to the above aspect of the invention, the third metal film is a gold film, wherein the third metal film is desirably in a range of 0.1 to 0.4 μm in thickness at the part laminated on the surface of the p-type semiconductor layer, and wherein the third metal film is desirably any of 0.05 to 0.2 μm in thickness at the part laminated on the surface of the p-type semiconductor thin-layer.

In the semiconductor device according to the above aspect of the invention, the third metal film is a silver film, wherein the third metal film may be in a range of 0.4 to 2.0 μm in thickness at the part laminated on the surface of the p-type semiconductor layer, and wherein the of the third metal film may be any of 0.2 to 1.0 μm in thickness at the part laminated on the surface of the p-type semiconductor thin-layer.

In the semiconductor device according to the above aspect of the invention, the semiconductor device is desirably an insulated gate bipolar transistor comprising; an insulated gate structure including a metal-oxide-semiconductor disposed in the semiconductor function region corresponding to an active region in which main current flows on one principal surface side of the n-type semiconductor substrate; and an emitter electrode insulated with the insulated gate structure by an interlayer insulating film, wherein the emitter electrode is disposed on one principal surface of the n-type semiconductor substrate; the metal electrode corresponding to a collector electrode realizing ohmic contact on the p-type semiconductor layer.

In the semiconductor device according to the above aspect of the invention, the n-type semiconductor substrate may include principally any material of silicon, silicon carbide, or gallium nitride.

According to the present invention, aluminum spiking can be minimized even after a treatment temperature is applied in soldering. Further, there is an advantage to providing a reverse-blocking-type semiconductor device that eliminates leak current caused by the aluminum spiking to increase and allows solder joining to be performed properly and easily.

DETAILED DESCRIPTION

Figure 1:
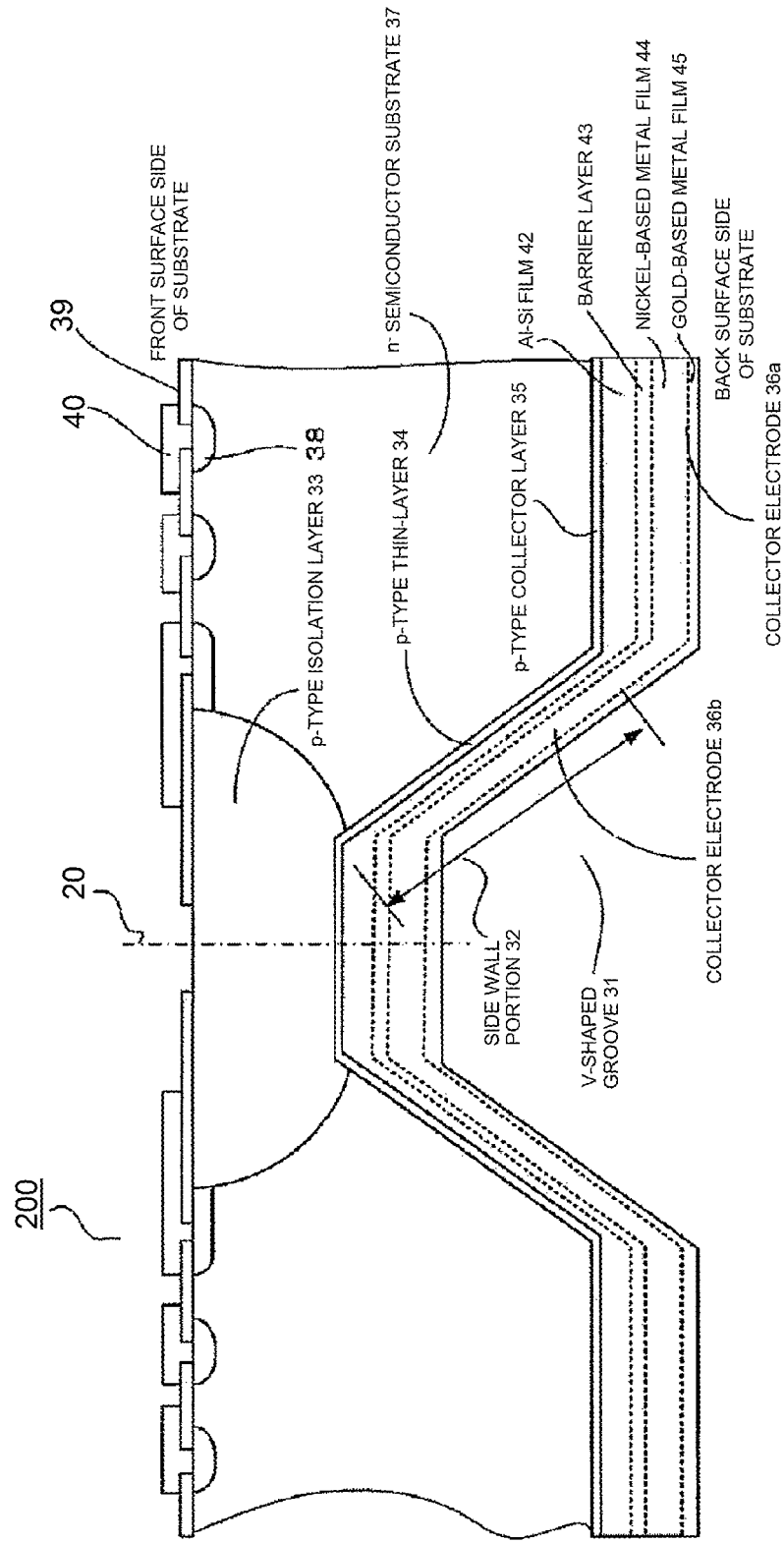
FIG. 1 is a sectional view illustrating a structure in the vicinity of a V-shaped groove of a reverse blocking IGBT according to an embodiment of the present invention.

In the following, referring to the attached figures, a non-limiting embodiment of a semiconductor device according to the present invention will is explained in detail. In the present description and the attached figures, "n" and "p" prefixed to layers and regions indicate that the majority carriers are an electron and a hole, respectively. Further, it will be explained so that the first conductivity-type indicates the n-type, and the second conductivity-type the p-type. "+" and "−" appended to an "n" or a "p" indicate that the impurity concentrations are higher and lower, respectively, than layers and regions without "+" and "−". In addition, according to the description of the embodiment and the attached figures, same reference numerals are given to identical configurations and redundant descriptions are omitted. Furthermore, the accompanying figures described in connection with the embodiment are not drawn by using accurate scale and proportion for the sake of being easily recognized or clearly understood. The invention is not limited to the details of the embodiment described hereinafter.

Embodiment

A structure of the semiconductor device according to the embodiment of the present invention will be described using an example of a reverse blocking IGBT. FIG. 1 is a sectional view illustrating a structure in the vicinity of a V-shaped groove of a reverse blocking IGBT according to an embodiment of the present invention. A reverse blocking IGBT 200 shown in FIG. 1 has a structure eliminating a conventional deep diffusion layer which stretches from the front surface to the back surface across an n$^-$ semiconductor substrate 37, in which the semiconductor material is, for example, silicon (Si). A p-type isolation layer 33 of the reverse blocking IGBT 200 is a shallow p-type impurity diffusion layer having a predetermined depth from the front surface of the n$^-$ semiconductor substrate 37. A V-shaped groove 31 stretches from the back surface of the n$^-$ semiconductor substrate 37 to the bottom portion of the p-type isolation layer 33. A side wall portion 32 of the V-shaped groove 31 has a tapered shape with a predetermined angle of inclination to the back surface of the n$^-$ semiconductor substrate 37.

The predetermined depth of the p-type isolation layer 33 indicates a relationship so that the base portion of the V-shaped groove 31 formed from the back surface side of the n$^-$ semiconductor substrate 37 opposite to the p-type isolation layer 33 contacts the bottom portion of the p-type isolation layer 33. The shallower the p-type isolation layer 33 is formed, the deeper the V-shaped groove 31 has to be formed. On the other hand, if the p-type isolation layer 33 is formed to be excessively shallow, it becomes difficult to handle the wafer without breaking it after forming the V-shaped groove 31. The p-type isolation layer 33 may be about equal to or more than 50 μm in depth from the front surface of the n$^-$ semiconductor substrate 37. A dashed line 20 shown at the center of the p-type isolation layer 33 in FIG. 1 is a cutting line where the wafer is divided into chips. The p-type collector layer (second conductivity-type semiconductor layer) 35 is formed at the back surface flat portion surrounded by the V-shaped groove 31.

A p-type thin-layer (second conductivity-type semiconductor thin-layer) 34, which is thinner in thickness than the p-type collector layer 35, is formed along the inside wall (the side wall portion 32 and the base portion) of the V-shaped groove 31. The p-type thin-layer 34 contacts the p-type isolation layer 33 and the p-type collector layer 35. Since the p-type thin-layer 34 connects the p-type isolation layer 33 and the p-type collector layer 35 with the same conductivity-type, the p-type isolation layer 33 has a reverse withstand-voltage function as the p-type isolation layer with the conventional deep diffusion layer has. Configuring the reverse blocking IGBT 200 having such a p-type isolation layer 33 not only eliminates the formation of the p-type isolation layer including a diffusion layer as deep as piercing the n$^-$ semiconductor substrate 37 by performing conventional diffusion for long hours at a high temperature, but also allows demerits to be avoided for a decrease in breakdown voltage owing to generation of donors in the n$^-$ semiconductor substrate 37 associated with the diffusion for long hours at a high temperature, an increase in leak current owing to occurrence of crystal defects, deterioration in throughput of facilities, and the like. The configuration of the reverse blocking IGBT 200 will be described later in detail.

Figure 6:
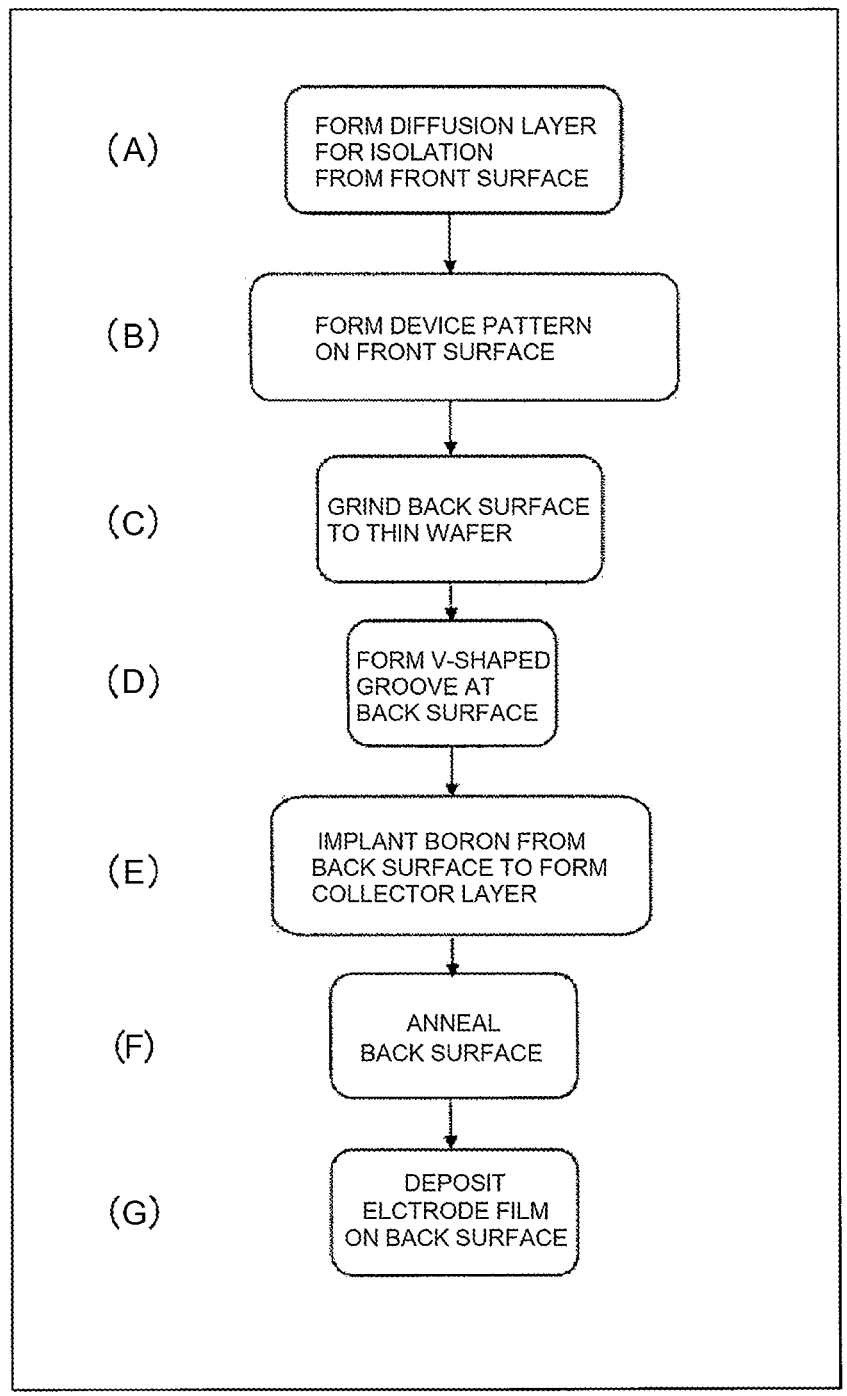
FIG. 6 is a flow chart showing a summary of a method for manufacturing the reverse blocking IGBT of the embodiment of the present invention.

A fabrication process of the semiconductor device according to the embodiment is similar to that of a conventional reverse blocking IGBT. An outline will be described using the reverse blocking IGBT 200 as an example. FIG. 6 is a flow chart illustrating the outline of the fabrication process of the reverse blocking IGBT according to the embodiment of the present invention. Firstly, the p-type isolation layer (diffusion layer for isolation) 33 is selectively formed in the surface layer on the front face of the n$^-$ semiconductor substrate 37, for example, by ion implantation and thermal diffusion ((A)

of FIG. 6). Next, in an active region (semiconductor function region), in which main current flows, disposed in the inner part surrounded by the p-type isolation layer 33 at the front surface side of the n⁻ semiconductor substrate 37, processes are sequentially performed to form MOS gate (insulated gate including metal-oxide-semiconductor) structures including a source region, a gate electrode, and the like (not shown) and device structures having a semiconductor function provided by the front-side components such as an emitter electrode and the like (not shown) ((B) of FIG. 6).

Next, a supporting substrate including a quartz glass or the like is stuck on the front side of the n⁻ semiconductor substrate 37 (n⁻ drift layer). Afterward, the back surface of the n⁻ semiconductor substrate 37 is ground to thin the n⁻ semiconductor substrate 37 to a predetermined thickness ((C) of FIG. 6). Next, the back surface (the surface which has been ground) of the n⁻ semiconductor substrate 37 is cleaned after grinding. Next, the V-shaped groove 31 is selectively formed, for example, by alkali etching from the back surface side of the n⁻ semiconductor substrate 37 opposite to the p-type isolation layer 33 ((D) of FIG. 6). The V-shaped groove 31 has a depth to reach the bottom portion of the p-type isolation layer 33. Next, the ion implanting process of boron (B) or the like as a p-type impurity is performed on the back surface (including the inside wall of the V-shaped groove 31) of the n⁻ semiconductor substrate 37 to form the p-type collector layer 35 at the back surface flat portion and a p-type thin-layer 34 along the side wall portion 32 of the V-shaped groove 31 simultaneously ((E) of FIG. 6).

Figure 5:
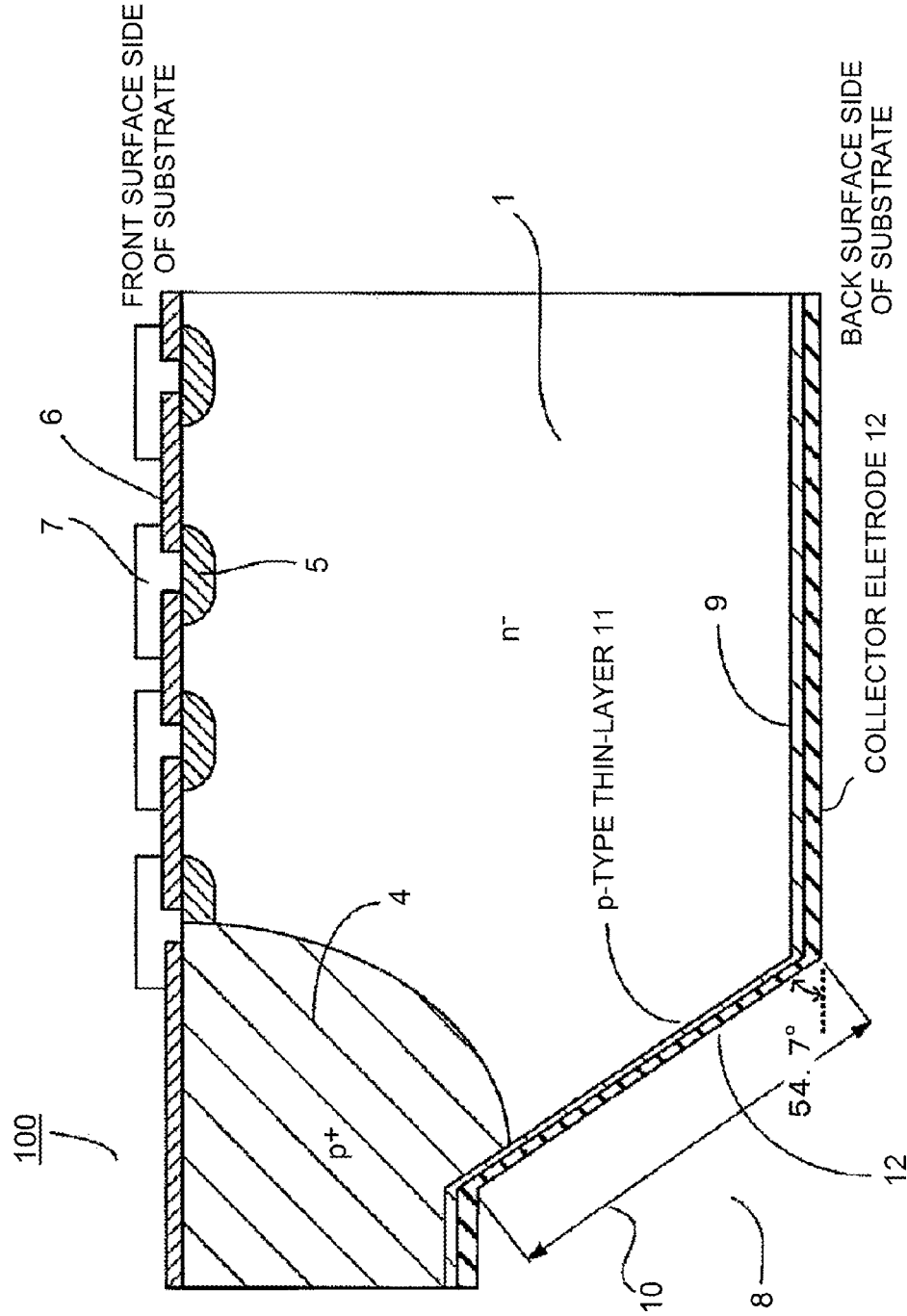
FIG. 5 is a sectional view illustrating a structure of an essential part of a conventional reverse blocking IGBT.

Next, annealing activates the p-type impurity implanted in the back surface (also including the inside wall of the V-shaped groove 31) of the n⁻ semiconductor substrate 37 ((F) of FIG. 6). Next, collector electrodes 36a and 36b which realize ohmic contact on the surfaces of the p-type collector layer 35 and the p-type thin-layer 34, respectively, are formed simultaneously, for example, by sputter deposition and the like ((G) of FIG. 6). This completes the reverse blocking IGBT 200 shown in FIG. 1. In FIG. 1, numeral 38 indicates a guard ring comprising a p-region disposed on the withstand-voltage structure region surrounding an active region; numeral 39 indicates a field insulation film; and numeral 40 indicates a field plate. The fabrication process except the formation condition for collector electrodes 36a and 36b may be similar to that of the conventional reverse blocking IGBT shown in FIG. 5.

In the present invention, the collector electrodes 36a and 36b on the back surface side of the substrate shown in FIG. 1 comprise at least a laminated film including in sequence from the back surface of the n⁻ semiconductor substrate 37: an Al—Si (aluminum-silicon) film (first metal film) 42, a metal film that includes, for example, principally nickel (Ni) (hereinafter, described as a nickel-based metal film 44: second metal film) having good solder wettability, and another metal film that includes, for example, principally gold (Au) (hereinafter, described as a gold-based metal film 45: third metal film) as the top surface metal film having a higher function to protect the nickel-based metal film 44 from being oxidized. A barrier layer 43 may be a metal film including principally titanium (Ti) or the like having a high melting point between the Al—Si film 42 and the nickel-based metal film 44. The barrier metal 43 has a function to prevent silicon (Si) atoms in the n⁻ semiconductor substrate 37 and tin (Sn) atoms in a solder joining layer which joins the collector electrodes 36a and 36b to a joined member (for example, a copper (Cu) plate on an insulation substrate) from diffusing.

With regard to the collector electrodes 36a and 36b, the aluminum spiking does not occur in a wafer state or a chip state even if the collector electrodes have the conventional configuration. Then the problems described above do not become apparent. During soldering treatment in assembly to mount the chip (n⁻ semiconductor substrate 37), however, applying heat to the chip allows the aluminum spiking to grow at the back surface of the semiconductor substrate 37, causing characteristic failures owing to the aluminum spiking to increase as identified by the present inventor. Further, if the Al—Si film is in a range of 0.3 to 1.0 μm in thickness, it is disclosed in Patent Literature 2 that problems are dissolved for reverse breakdown voltage failures caused by the aluminum spiking.

On the reverse blocking IGBT 200 having the V-shaped groove 31 according to the present invention, however, the tapered side wall portion 32 (for example, an angle of approximately 53.7° to the principal surface of the substrate) is formed in the V-shaped groove 31. Then, the collector electrode 36b at the side wall portion 32 in the V-shaped groove 31 becomes about half as thick as the collector electrode 36a formed simultaneously at the back surface flat portion along with the collector electrode 36b. The reason is that the travelling direction of the sputtered particles is perpendicular to the surface of the p-type collector layer 35 disposed at the back surface flat portion in the sputtering process to form the collector electrode 36a and 36b. Further, the p-type thin-layer 34 at the side wall portion 32 in the V-shaped groove 31 becomes about half as thick as the p-type collector layer 35 formed at the back surface flat portion simultaneously along with the p-type thin-layer 34. The reason is that the direction of the ion implantation to form the p-type thin-layer 34 is not perpendicular to the side wall portion 32 in the V-shaped groove 31.

In this way, even if the Al—Si film 42 is set in a range of 0.3 to 1.0 μm in thickness as described in Patent Literature 2, the p-type thin-layer 34 and the Al—Si film 42 formed along the side wall portion 32 in the V-shaped groove 31 become thinner in thickness than the collector layer 35 and the Al—Si film 42 formed on the back surface flat portion, respectively. That is, it is ascertained that the p-type thin-layer 34 and the Al—Si film 42 formed along the side wall portion 32 in the V-shaped groove 31 are not necessarily sufficient in thickness to prevent the reverse breakdown voltage failures. Therefore, the thickness of the Al—Si film 42, which is in a range of 0.3 to 1.0 μm as described in Patent Literature 2 described above, is insufficient in order to eliminate reverse breakdown voltage failures caused by assembly process including soldering treatment in the reverse blocking IGBT 200 according to the present invention.

Investigating a proper thickness for eliminating the reverse breakdown voltage failures derives the following good results about each metal film constituting the collector electrode 36a and 36b of the reverse blocking IGBT 200 according to the present invention. The results will be described below.

In the reverse blocking IGBT 200 according to the present invention, the Al—Si film 42 in the collector electrode 36a is set, for example, in a range of 1.1 to 3.0 μm in thickness (the target thickness on the back surface flat portion), and the Al—Si film 42 in the collector electrode 36b, which is in contact with the surface (the side wall portion 32 in the V-shaped groove 31) of the p-type thin-layer 34, is set, for example, in a range of 0.55 to 1.5 μm in thickness. This reveals that it is optimum for the thickness of the Al—Si film 42 to eliminate the reverse breakdown voltage failures. The reason will be described later. The Al—Si film 42 in the collector electrode 36a may be particularly around 2 μm in thickness. The reason is that setting the Al—Si film 42 in thickness of 2 μm in the collector electrode 36a enables the Al—Si film 42 in the collector electrode 36b, which is simultaneously formed with the collector electrode 36a, to be at least approximately 1 µm in thickness even if the thickness decreases because of the inclination part (the side wall portion 32 in the V-shaped groove 31). These collector electrodes 36a and 36b, which differ from the conventional reverse blocking IGBT 100, can minimize both of the aluminum spikes which occur easily on each surface of the p-type collector layer 35 and the p-type thin-layer 34 of the back surface of the substrate (including the inside wall of the V-shaped groove 31), suppressing an increase in leak current. Adding titanium into the Al—Si film 42 also suppresses silicon atoms from diffusing out of the n⁻ semiconductor substrate 37, which uses silicon as a semiconductor material.

The collector electrodes 36a and 36b comprising the barrier layer 43 may principally include a high melting point metal between the Al—Si film 42 and a metal film (nickel-based metal film 44), which is, for example, principally nickel with a good solder wettability. The barrier metal 43 may include any metal among titanium, tungsten (W), and platinum (Pt), as a main component. The reason is that the barrier metal 43 brings about an effect to prevent silicon atoms, tin atoms, and the like from diffusing as described earlier. If tin atoms in the solder including tin diffuse and pass through the nickel-based metal film 44 to reach the Al—Si film 42, a failure that separation happens easily at the interface between the Al—Si film 42 and the nickel-based metal film 44 because no alloy will be formed between tin atoms and aluminum atoms. Therefore, tin atoms may be prevented from diffusing into the Al—Si film 42.

Further, the barrier layer 43 in the collector electrode 36a is set, for example, in a range of 0.08 to 0.2 µm in thickness (target thickness on the back surface flat portion) and may be 0.15 µm in thickness. This can effectively stop tin atoms from diffusing out of the solder joining layer including tin by using the barrier layer 43, revealing that the separation can be avoided at the interface between the Al—Si film 42 and the nickel-based metal film 44. The barrier layer 43 may be, for example, in a range of 0.03 to 0.1 µm in thickness (target thickness on the side wall portion of the V-shaped groove). The barrier layer 43 may be a metal film including, for example, either tungsten or platinum as a main component besides a metal film including titanium as a main component. Moreover, a titanium nitride (TiN) film may also be employed for the barrier layer 43 because of its highly enhanced barrier capability.

With regard to the nickel-based metal film 44 and the gold-based metal film 45, the excess decrease in thickness causes wetting and spreading of the solder to deteriorate. On the other hand, with regard to the nickel-based metal film 44 and the gold-based metal film 45, the increase in thickness causes warping to occur easily in the n⁻ semiconductor substrate 37 owing to the film stress, or results in disadvantages in costs. Accordingly, the nickel-based metal film 44 is, for example, in a range of 0.2 to 1.2 µm in thickness on the back surface flat portion (namely, the part of the collector electrode 36a), and is, for example, in a range of 0.1 to 0.6 µm in thickness at the side wall portion 32 (namely, the part of the collector electrode 36b) of the V-shaped groove 31, in particular, at approximately 0.35 µm in thickness. The gold-based metal film 45 is, for example, in a range of 0.1 to 0.4 µm in thickness on the back surface flat portion, and is, for example, in a range of 0.05 to 0.2 µm in thickness, in particular, at approximately 0.1 µm in thickness at the side wall portion 32 of the V-shaped groove 31. Vanadium (V) may be added in the nickel-based metal film 44. Turning the nickel-based metal film 44 into a non-magnetic material by adding vanadium (V) may enlarge an erosion area during film deposition by sputtering. This can extend the target-life, bringing merits in costs.

Further, tin and germanium (Ge) may be added into the gold-based metal film 45 to improve solder wettability and the like. Or, a metal film including silver (Ag) (hereinafter, described as silver-based metal film: the third metal film) as a main component is also available instead of the gold-based metal film 45, because gold is expensive. The silver-based metal film is easily oxidized in comparison with the gold-based metal film 45. The silver-based metal film may be two times as thick as the gold-based metal film 45: for example, in a range of 0.4 to 2.0 µm in thickness on the back surface flat portion and in a range of 0.2 to 1.0 µm in thickness at the side wall portion 32 of the V-shaped groove 31. Moreover, palladium (Pd) may be added to the gold-based metal film 45 in order to improve the wettability and the like.

Figure 2:
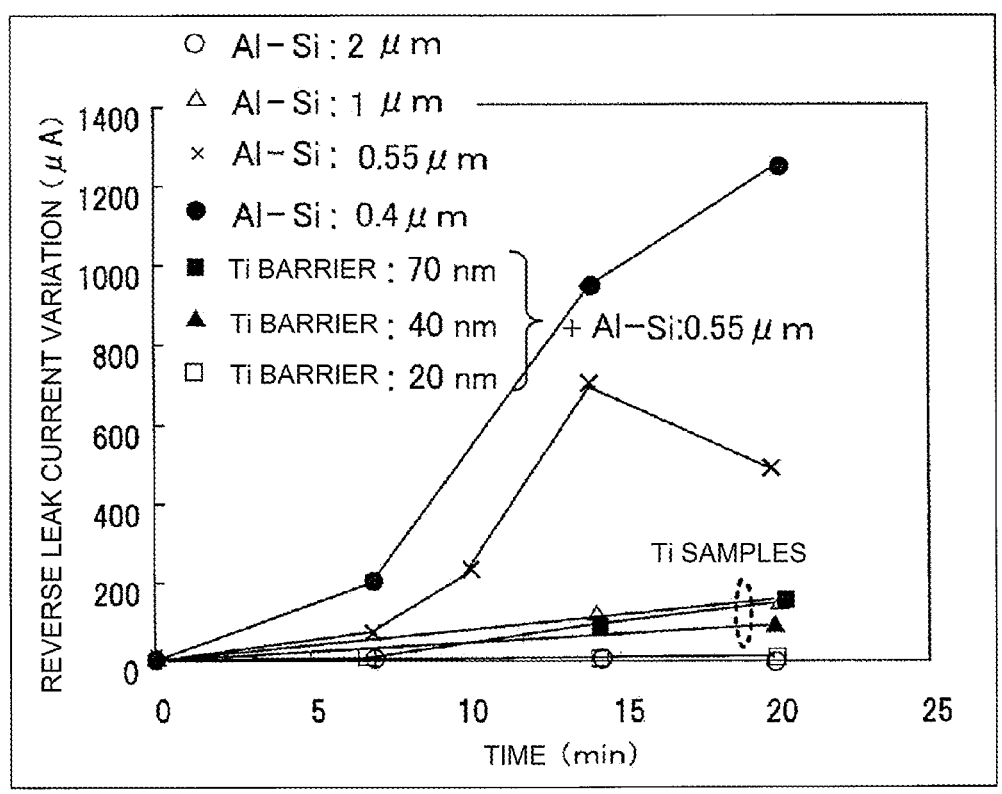
FIG. 2 is a characteristic view showing a relation between a retention time and a reverse leak current variation at a soldering treatment temperature when mounting the reverse blocking IGBT.
Figure 3:
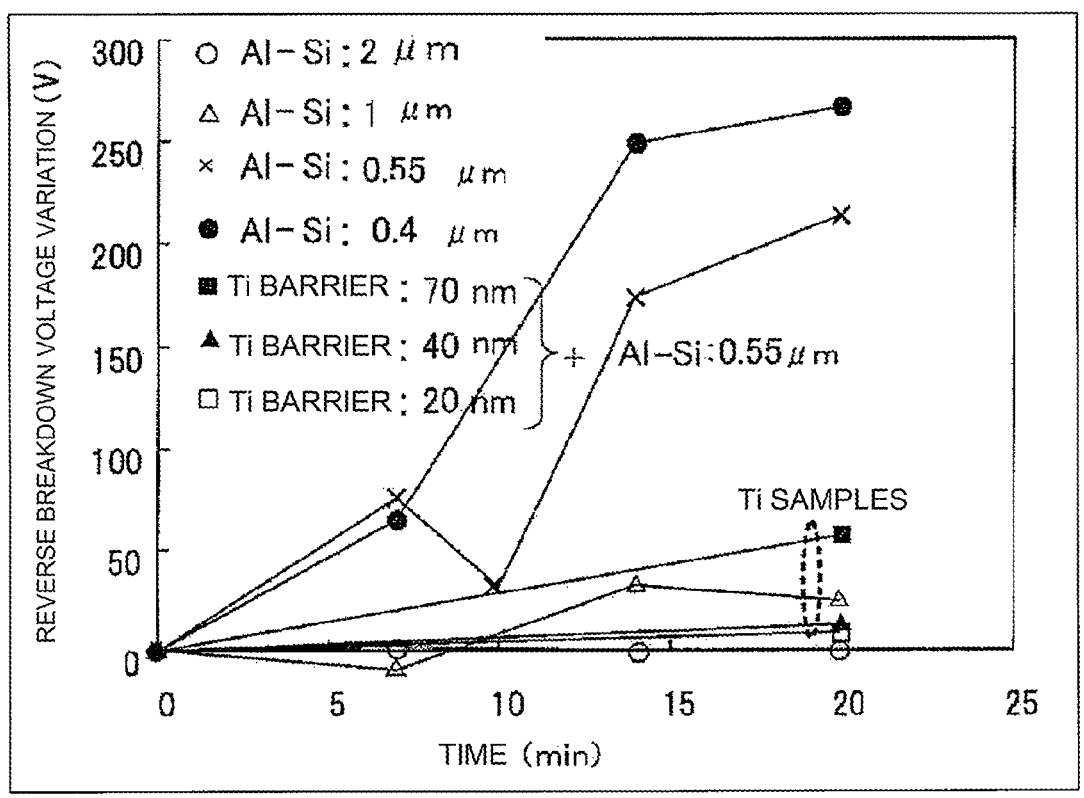
FIG. 3 is a characteristic view showing a relation between a retention time and a reverse breakdown voltage variation at a soldering treatment temperature when mounting the reverse blocking IGBT.

The Al—Si film 42 and the barrier layer 43 are examined with regard to the thickness. A reverse leak current variation and a reverse breakdown voltage variation (vertical axis) to each of retention times (horizontal axis) in which parameters are thicknesses of the Al—Si film 42 and the barrier layer 43 (titanium film) in the collector electrode 36a and 36b of the reverse blocking IGBT 200 at the treatment temperature in soldering are shown in FIGS. 2 and 3, respectively. FIG. 2 is a characteristic view illustrating a relation between the retention time and the reverse leak current variation at the treatment temperature in soldering when mounting the reverse blocking IGBT. FIG. 3 is a characteristic view illustrating a relation between the retention time and the reverse breakdown voltage variation at the treatment temperature in soldering when mounting the reverse blocking IGBT. Both FIGS. 2 and 3 show the results for four samples (indicated by "Al—Si") in which the Al—Si films are different in thickness from one another and for three samples (indicated by "Ti barrier+Al—Si" and also as "Ti samples") in which each of the Al—Si films is 0.55 µm in thickness, and the barrier layers are different from one another in thickness.

The results shown in FIGS. 2 and 3 reveal that depositing the Al—Si film of 2 µm in thickness causes hardly any increase in leak current and any decrease in reverse breakdown voltage. The results shown in FIGS. 2 and 3 also indicate that the increase in leak current and the decrease in breakdown voltage are small, provided that the barrier layer is formed even though the Al—Si film is 0.55 µm in thickness. Based upon the results, a lower limit of the Al—Si film 42, which namely corresponds to the lower limit of the Al—Si film 42 of the collector electrode 36b at the side wall portion 32 of the V-shaped groove 31, is specified to be 0.55 µm in thickness, and the scope of the present invention includes that the Al—Si film 42 is equal to or more than 0.55 µm in thickness. When the Al—Si film 42 is 0.55 µm in thickness at the collector electrode 36b, the lower limit of the Al—Si film 42 becomes 1.1 µm in thickness at the back surface flat portion in the collector electrode 36a.

Further, the reason why the upper limit of the Al—Si film 42 is determined to 3.0 µm in thickness at the collector electrode 36a is not for the improvement of the reverse breakdown voltage described above but due to the increase of on-state voltage when the silicon concentration in the Al—Si film 42 rises excessively. This point has been taken into account for the determination. When the upper limit of the Al—Si film 42 is set to 3.0 µm in thickness at the collector electrode 36a, the upper limit of the Al—Si film 42 becomes 1.5 µm in thickness at the collector electrode 36b of the side wall portion 32 in the V-shaped groove 31. Therefore, an advantageous thickness of the Al—Si film 42 of around 1 µm can be ensured. Putting these together, as described above, indicates that the Al—Si film 42 is determined in a range of 1.1 to 3.0 μm in thickness (the target thickness at the back surface flat portion) at the collector electrode 36a, and in a range of 0.55 to 1.5 μm in thickness at the collector electrode 36b contacting the surface of the p-type thin-layer 34.

Figure 4:
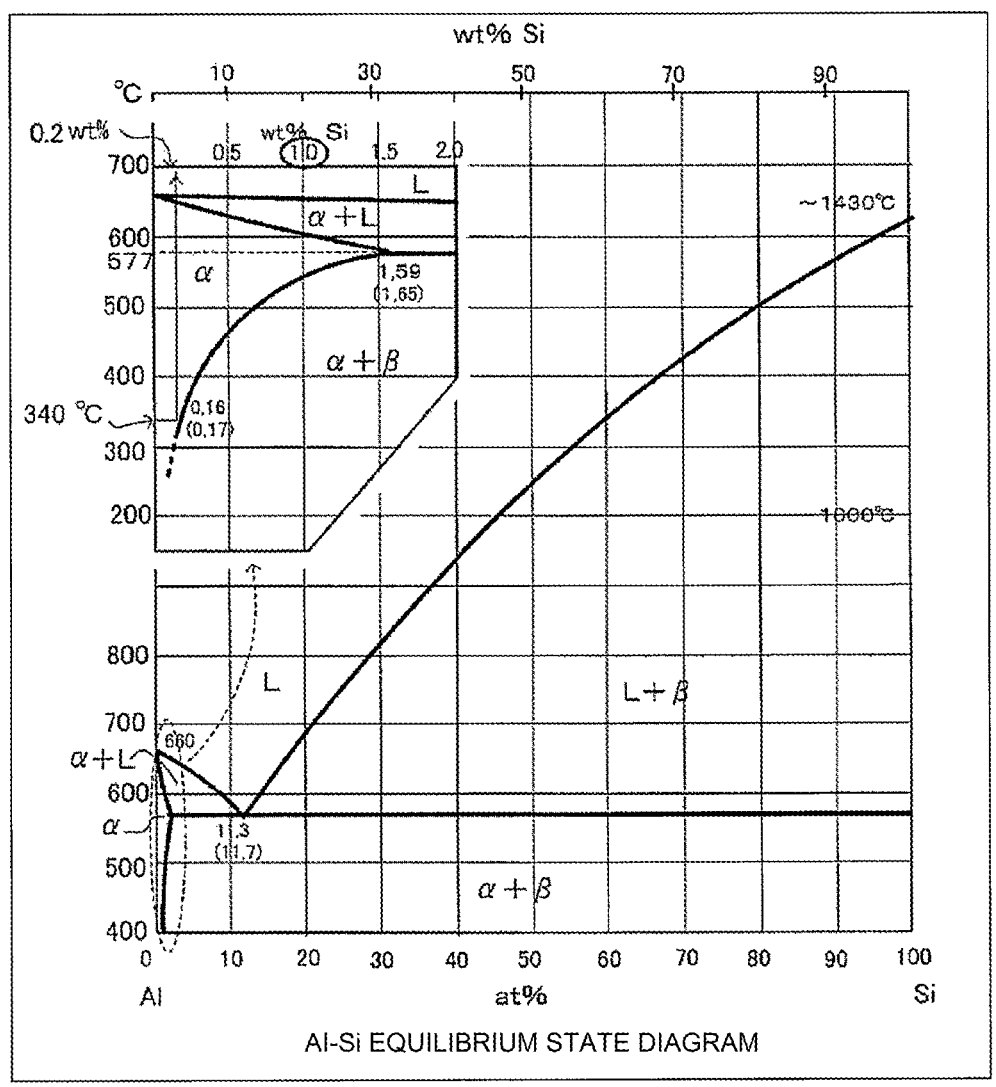
FIG. 4 is a characteristic diagram showing a thermal equilibrium state of the aluminum-silicon alloy.

Next, a relation is examined between a process temperature and mutual diffusion in the Al—Si film 42 during chip mounting and assembly. FIG. 4 is a characteristic view illustrating a thermal equilibrium state of the aluminum-silicon alloy (hereinafter, described as "Al—Si equilibrium state diagram"). As shown in the Al—Si equilibrium state diagram of FIG. 4, the mutual diffusion will start when a processing temperature is 340° C. during mounting and assembly processes such as soldering and the like if a silicon concentration is as low as about 0.2 wt. % in the Al—Si film at the interface with the p-type collector layer surface of the back surface of the semiconductor substrate. On the other hand, if the Al—Si film has enough thickness, silicon is filled sufficiently in the process of the Al—Si film growing up. In addition, increasing the Al—Si film in thickness allows the total amount of silicon to increase in the Al—Si film. This permits the silicon concentration to be ensured sufficiently in the Al—Si film even if a temperature is 340° C. during soldering treatment, eliminating problems. The reason is presumably that the thick Al—Si film would allow the aluminum spiking to occur rarely or not at all because of the total amount of silicon in the thick Al—Si film and the silicon atom diffusion length even if the phenomenon could happen so that silicon atoms of the Al—Si film diffuse into, for example, the titanium-based metal film being a barrier layer.

Even if the thickness of the Al—Si film 42 is similar to that of the conventional reverse blocking IGBT, lowering the treatment temperature in soldering suppresses the leak current increase and prevents the reverse breakdown voltage from deteriorating. This is known and also demonstrated clearly by the Al—Si equilibrium state diagram shown in FIG. 4. In the conventional method for lowering the treatment temperature in soldering, however, oxide films formed on the surfaces of the solder and the copper plate on a DCB (Direct Copper Bonding: an insulation substrate on which a copper plate or the like as a metal plate is joined) are hardly deoxidized by hydrogen, causing new problems such as occurrence of voids with ease at the interface between the DCB disposed under a chip and solder. Then lowering the treatment temperature in soldering cannot be applied for measures to improve reverse breakdown voltage failures. Namely, brought about frequently at the interface between the solder and the DCB, the voids generated when lowering the treatment temperature in soldering raise thermal resistivity. This might cause a thermal runaway of the chip and result in destruction.

As described above, according to the present invention, a sufficient thickness of the Al—Si film 42, which is in a range of 1.1 to 3.0 μm at the back surface flat portion, allows the treatment temperature in soldering to be raised until a temperature region in which the voids do not occur anymore at the interface between the solder and the DCB is reached. This can suppress increase in the leak current and decrease in the reverse breakdown voltage.

Further, securing a sufficient thickness for the titanium-based metal film or the like as the barrier layer 43 enables separation to be avoided at the interface between the solder and the Al—Si film 42. This will be described further in the following. Tin atoms, which are a component of the solder, do not form any alloy layer with aluminum atoms in the Al—Si film 42. Then, when tin atoms in the solder joining layer diffuse into the Al—Si film 42 in the assembly process including soldering, the solder joining is not properly performed. Then the separation might occur in the solder joining layer. Accordingly, depositing the collector electrode 36a and 36b in which the titanium-based metal film being a barrier layer 43 is sandwiched in the configuration thereof on the Al—Si film 42 prevents tin atoms from diffusing into the Al—Si film 42 by using the barrier layer 43 when joining the reverse blocking IGBT chip with solder on the DCB. The barrier layer 43 to prevent tin atoms in the solder joining layer from diffusing into the Al—Si film 42 may be equal to or more than 0.03 μm in thickness at the side wall portion 32 of the V-shaped groove 31. The reason is as follows. If the titanium-based metal film (namely, the barrier layer 43 of the collector electrode 36b) is less than 0.03 μm in thickness at the side wall portion 32 of the V-shaped groove 31, tin atoms in the solder pass through the titanium-based metal film, reaching the Al—Si film 42. The tin atoms arriving at the Al—Si film 42 will not form any alloy layer with aluminum atoms in the Al—Si film 42, and then there happens a problem that separation occurs easily at the interface between the Al—Si film 42 and the titanium-based metal film where tin atoms have diffused.

According to the present invention, the thickness of the collector electrode 36a increases on the back surface flat portion in the n⁻ semiconductor substrate 37. Even though the collector electrode 36a increases in thickness, disposing the V-shaped groove 31 at the back surface side of the n⁻ semiconductor substrate 37 causes an applied direction of shrinkage stress in the collector electrode 36a and 36b to change at the V-shaped groove 31. As a result, there is also a merit: warping can be suppressed to be smaller for the wafer having the V-shaped groove 31 on the back surface of the n⁻ semiconductor substrate 37 than for the wafer in which the collector electrode is deposited only on the back surface flat portion eliminating the V-shaped groove 31.

As described above, according to the embodiment, there is provided as follows. A collector electrode, in which at least the part contacting the semiconductor substrate is an Al—Si film, is formed. The Al—Si film is set in a range of 1.1 to 3.0 μm in thickness at the back surface flat portion, and in a range of 0.55 to 1.5 μm at the side wall portion of the V-shaped groove, wherein the solder joining can be performed properly and easily when mounting a chip. Further, this permits the aluminum spiking owing to the process temperature during chip mounting and assembly such as soldering and the like to be minimized at the back surface flat portion and side wall portion of the V-shaped groove. And then, minimizing the aluminum spiking at the back surface flat portion and at the side wall portion of the V-shaped groove allows the leak current caused by the aluminum spiking to be reduced and can prevent the reverse breakdown voltage failures. Further, according to the embodiment, disposing the collector electrode, which is formed by laminating at least an Al—Si film and a nickel-based metal film from the semiconductor substrate side and also disposing a barrier layer between the Al—Si film and the nickel-based metal film allow the barrier layer to stop the diffusion of tin atoms in solder even in the case of employing solder including tin. Thus, this permits the separation to be avoided for the solder joining layer.

In the above description, the present invention is not limited to the embodiment described above and is changeable variously. For example, according to the embodiment described above, an example is described by using a semiconductor substrate in which the semiconductor material is silicon, but not limited to this, and a semiconductor material may be, for example, silicon carbide (SiC) or gallium nitride (GaN) as a semiconductor substrate. Further, although the described embodiment has the n-type for the first conductivity-type and the p-type for the second conductivity-type, the present invention also comes into existence similarly when using the p-type for the first conductivity-type and the n-type for the second conductivity-type.

INDUSTRIAL APPLICABILITY

As described above, the semiconductor device according to the present invention is useful for a power semiconductor device employed in a power conversion apparatus and the like, in particular, for a reverse blocking IGBT having highly reliable breakdown voltage characteristics bi-directionally in forward and reverse directions.

Explanations of Letters or Numerals

31: V-shaped groove
32: Side wall portion of V-shaped groove
33: p-type isolation layer
34: p-type thin-layer
35: p-type collector layer
36: Collector electrode
36a: Collector electrode at back surface flat portion
36b: Collector electrode at side wall portion of V-shaped groove
37: n⁻ semiconductor substrate
38: Guard ring
39: Field insulation film
40: Field plate
42: Al—Si film
43: Barrier layer
44: Nickel-based metal film
45: Gold-based metal film

The invention claimed is:
1. A semiconductor device comprising:
a second conductivity-type isolation layer surrounding a semiconductor function region, wherein the second conductivity-type isolation layer is disposed from one principal surface of a first conductivity-type semiconductor substrate, having a predetermined depth;
a V-shaped groove reaching a bottom portion of the isolation layer from another principal surface of the semiconductor substrate;
a second conductivity-type semiconductor layer disposed at a part surrounded by the V-shaped groove in the other principal surface of the semiconductor substrate;
a second conductivity-type semiconductor thin-layer coupling the isolation layer and the second conductivity-type semiconductor layer, wherein the second conductivity-type semiconductor thin-layer is disposed along a side wall of the V-shaped groove; and
a metal electrode contacting a surface of the second conductivity-type semiconductor layer and a surface of the second conductivity-type semiconductor thin-layer,
wherein the metal electrode at least includes a laminated film configured in a sequence of a first metal film including aluminum and silicon, a second metal film having a metal with solder wettability principally, and a third metal film preventing the second metal film from being oxidized from the semiconductor substrate side, and
wherein the first metal film is in a range of 1.1 to 3.0 μm in thickness at a part contacting the surface of the second conductivity-type semiconductor layer,
wherein the first metal film is in a range of 0.55 to 1.5 μm in thickness at a part contacting the surface of the second conductivity-type semiconductor thin-layer.
2. The semiconductor device according to claim 1, wherein the metal electrode further includes a barrier layer, which has principally a metal with a higher melting point than a melting point of the first metal film and the second metal film, between the first metal film and the second metal film.
3. The semiconductor device according to claim 2, wherein the barrier layer is a metal film including principally any metal of titanium, tungsten, or platinum.
4. The semiconductor device according to claim 2, wherein the barrier layer is in a range of 0.08 to 0.2 μm in thickness at a part laminated on the surface of the second conductivity-type semiconductor layer, and
wherein the barrier layer is in a range of 0.03 to 0.1 μm in thickness at a part laminated on the surface of the second conductivity-type semiconductor thin-layer.
5. The semiconductor device according to claim 1, wherein the second metal film is a nickel film,
wherein the second metal film is in a range of 0.2 to 1.2 μm in thickness at a part laminated on the surface of the second conductivity-type semiconductor layer, and
wherein the second metal film is in a range of 0.1 to 0.6 μm in thickness at a part laminated on the surface of the second conductivity-type semiconductor thin-layer.
6. The semiconductor device according to claim 1, wherein the third metal film is a gold film,
wherein the third metal film is in a range of 0.1 to 0.4 μm in thickness at a part laminated on the surface of the second conductivity-type semiconductor layer, and
wherein the third metal film is in a range of 0.05 to 0.2 μm in thickness at a part laminated on the surface of the second conductivity-type semiconductor thin-layer.
7. The semiconductor device according to claim 1, wherein the third metal film is a silver film,
wherein the third metal film is in a range of 0.4 to 2.0 μm in thickness at a part laminated on the surface of the second conductivity-type semiconductor layer, and
wherein the third metal film is in a range of 0.2 to 1.0 μm in thickness at a part laminated on the surface of the second conductivity-type semiconductor thin-layer.
8. The semiconductor device according to claim 1, wherein an insulated gate bipolar transistor comprises:
an insulated gate structure including a metal-oxide-semiconductor disposed in the semiconductor function region corresponding to an active region in which main current flows at the one principal surface side of the semiconductor substrate;
an emitter electrode insulated from the insulated gate structure by an interlayer insulating film, wherein the emitter electrode is disposed on the one principal surface of the semiconductor substrate;
the metal electrode corresponding to a collector electrode realizing ohmic contact on the second conductivity-type semiconductor layer.
9. The semiconductor device according to claim 1, wherein the semiconductor substrate includes principally any material of silicon, silicon carbide, or gallium nitride.
10. A semiconductor device comprising:
an isolation layer formed in an upper surface of a semiconductor substrate;
a groove in the semiconductor substrate below the isolation layer;
a collector layer on a lower surface of the semiconductor substrate;

a coupling layer on a wall of the groove, coupling the isolation layer and the collector layer; and a collector electrode formed on the coupling layer and the collector layer, the collector electrode comprising a plurality of layers.

11. The semiconductor device of claim 10, wherein the collector electrode has a different thickness in apart formed on the collector layer from a thickness of a part formed on the coupling layer.

12. The semiconductor device of claim 11, wherein the thickness of the part formed on the collector layer is greater than the thickness of the part formed on the coupling semiconductor layer.

13. The semiconductor device of claim 10, wherein the plurality of layers includes a first layer in contact with the collector layer and including aluminum and silicon, a second layer formed on the first layer, the second layer to act as a barrier against diffusion of unwanted atoms from adjoining layers, and a third layer formed on the second layer, the third layer including nickel.

14. The semiconductor device of claim 13, wherein the second layer includes at least one of titanium, tungsten or platinum.

15. The semiconductor device of claim 13, further comprising a fourth layer formed on the third layer to prevent oxidation of the third layer.

\* \* \* \* \*